United States Patent [19]

Takami

[11] Patent Number: 5,304,428
[45] Date of Patent: Apr. 19, 1994

[54] COPPER FOIL FOR PRINTED CIRCUIT BOARDS

[75] Inventor: Masato Takami, Uji, Japan

[73] Assignee: Fukuda Metal Foil and Powder Co., Ltd., Japan

[21] Appl. No.: 12,173

[22] Filed: Feb. 2, 1993

Related U.S. Application Data

[62] Division of Ser. No. 800,927, Dec. 4, 1991, Pat. No. 5,234,573.

[51] Int. Cl.$^5$ .............................................. B32B 15/20
[52] U.S. Cl. .................... 428/607; 428/675; 428/935
[58] Field of Search ............... 428/607, 658, 675, 935

[56] References Cited

U.S. PATENT DOCUMENTS

| | | | |
|---|---|---|---|
| 3,857,681 | 12/1974 | Yates et al. | 428/675 |
| 4,049,481 | 9/1977 | Morisaki | 428/658 |
| 4,386,139 | 5/1983 | Nakatsugawa | 428/658 |
| 4,857,387 | 8/1989 | Eberhardt et al. | 428/607 |
| 5,019,222 | 5/1991 | Hino et al. | 205/152 |

FOREIGN PATENT DOCUMENTS

| | | | |
|---|---|---|---|
| 1105185 | 1/1957 | Fed. Rep. of Germany | 428/675 |
| 2-122926 | 5/1990 | Japan | 428/658 |
| 1349696 | 4/1974 | United Kingdom | 428/607 |

Primary Examiner—John Zimmerman
Attorney, Agent, or Firm—Lowe, Price, LeBlanc & Becker

[57] ABSTRACT

A method of surface treatment of a copper foil for printed circuit boards comprising the steps of forming a treating layer of copper-zinc or copper-zinc-nickel by electrolysing at least a side of a copper foil in a manner of cathodic electrolysis in a bath of copper-zinc including copper ion, zinc ion, tartaric acid and alkali or further including nickel ion, and giving a chromate treatment to the copper foil. A copper foil for printed circuit boards obtained by using a copper-zinc-nickel bath.

1 Claim, 1 Drawing Sheet

COPPER FOIL FOR PRINTED CIRCUIT BOARDS

This application is a divisional application of application Ser. No. 07/800,927, filed Dec. 4, 1991, now U.S. Pat. No. 5,234,573.

BACKGROUND OF THE INVENTION

1. Field of the Invention

The present invention relates to a surface treatment of a copper foil and more particularly to a copper foil for printed circuit boards which has very little deterioration against peel strength due to heat, i.e. a heat resistance against high temperature where the copper foil is adhered to a resin of a base material for the printed circuit boards.

2. Prior Art

Manufacturing techniques for printed circuit boards have progressed rapidly year by year and high efficiency and high reliability are required greatly in manufacturing. These requirements are attended severely to a copper foil as one of the materials for the printed circuit boards.

The first stage of manufacturing the printed circuit boards comprises the steps of laminating a copper foil onto a base substrate into which resin is impregnated, and heating and pressing them together by a pressing process to obtain a copper clad laminate. A glass epoxy substrate, which is used normally and frequently as the base substrate, is formed at 160° C.~170° C. 1~2 hours, but a higher temperature and longer time are required as conditions for glass polyimide substrate or special resins having high durability which are used increasingly nowadays.

Further, according to progression of surface mounting technology, such techniques are progressed in a direction for necessitating a long time in heating the printed circuit boards due to reflow in soldering, and after the boards are completed, the printed circuit board is required to have a heat resistance due to progression of high density in circuits wherein the temperature rises during operation of the apparatus. As an example, UL796 Standard rules that peel strength of a copper foil should be more than 2 pounds/inch (0.357 Kg/cm) after conducting heat-treatment of 177° C. for 10 days as a test of high temperature heat resistance.

Furthermore, including the heat resistance as mentioned above, the copper foil for printed circuit boards should be of course satisfied with a number of requirements including chemical resistance such as acid resistance after adhesion of the copper foil with the resin of the base boards, the resistance to discoloration of the board after etching (the resistance to Brown transfer), and stainlessness(no residue or spot) after etching.

In order to satisfy the above mentioned requirements for the copper foil for printed circuit boards, the following conventional method of surface treatment has been proposed. For example, Japanese patent publication No. 51-35711 discloses a method of coating a surface of a copper foil with a layer consisting of a group of zinc, indium, and brass and Japanese patent publication No. 53-39376 discloses a method of providing a copper layer of electrodeposition comprising two layers and these are further coated with a zinc layer.

An alloy layer comprising zinc as a main component is superior in heat resistance. However, the layer is very weak in chemical resistance with respect to acid, and therefore after lamination of the copper foil with the resin, undercut occurrs in etching, particularly in etching by cupric chloride.

Further, in acid washing or soft etching in a process of manufacturing the printed circuit boards, it occurrs such a problem that peel strength of the copper foil against the resin of the base board becomes lower so that the printed circuit boards may be lifted out of the board.

Although a brass layer has characteristics satisfying both of heat and chemical resistances in a narrow range of composition, any method was never established industrially except using a cyanide bath when providing a brass layer. When using such a cyanide bath, there was a serious problem in public pollution in treating the waste liquid of cyanide from the bath and treating a rinsing water for the brass layer.

Further, if the brass layer is provided by a normal electrolysis utilizing high current density, it departs from a range of appropriate plating so that a powdered deposition is produced. As the result, it occurrs such a problem that the powdered deposition sometimes becomes stains after etching or causes peel strength and chemical resistance to be lowered.

SUMMARY OF THE INVENTION

Then, the inventor of the present invention researched and studied in various ways in view of the above mentioned problems, and as the result has succeeded in forming a copper-zinc treating layer which is superior in both of heat and chemical resistances without using cyanide completely.

Namely, the present invention relates to a method of surface treatment of a copper foil for printed circuit boards comprising the steps of forming a treating layer of copper-zinc by electrolizing at least a side of a copper foil as a cathode in a treating bath of copper-zinc including copper ion, zinc ion, tartaric acid and alkali, and giving a chromate treatment to the copper foil.

And, it is preferable that intensity of alkali in the copper-zinc bath is set by using sodium hydroxide at the concentration of more than 60 g/l and the ratio of copper ion to zinc ion is set to be from 0.8 to 3.0.

The essential functions of the present invention will be described below.

The copper-zinc treating bath used in the method of the present invention has a basic composition comprising copper ion, zinc ion, tartaric acid and alkali.

Copper sulfate, copper tartrate or the like may be used as a supplying source of the copper ion. It is preferable to obtain the concentration of the copper ion by using such a material in a range of 2~12 g/l. Zinc sulfate, zinc tartrate, zinc oxide or the like may be used as a supplying source of zinc ion. It is preferable to obtain the concentration of the zinc ion by using such a material in a range of 1~6 g/l. When the concentrations of the copper ion and the zinc ion are beyond the above mentioned ranges, it becomes difficult to obtain a good electrodeposition.

The ratio of copper ion to zinc ion is set to be from 0.8 to 3.0 in the range of each of the concentrations of the copper ion and the zinc ion. When the ratio is set low or small, the ratio of deposition of the zinc becomes large and superior in heat resistance, but becomes weak in the resistance to hydrochloric acid. When the ratio of the copper ion to the zinc ion is set high or large, the ratio of deposition of the copper becomes too large and superior in the resistance to hydrochloric acid, but weak in heat resistance. Therefore, the above mentioned ranges should be chosen in order to satisfy both of the requirements.

A supplying source of the tartaric acid is Rochelle salt, potassium tartrate, sodium tartrate or the like. The concentration of the tartaric acid necessitates above 0.5 as a mole ratio of the tartaric acid to the copper in the above mentioned ranges of the concentrations of the copper ion and the zinc ion for complex ionization of these metals.

A supplying source of the alkali is sodium hydroxide or potassium hydroxide and it is preferable that the intensity of alkali or alkalinity is obtained by using sodium hydroxide of more than 60 g/l within the ranges of the concentrations of the copper and zinc ions. The intensity of alkali shows a neutralizing amount of alkali in titration, and is different from a total amount of addition of sodium hydroxide. Where sodium hydroxide is used lower than 60 g/l, the property of anti-hydrochloric acid becomes low in the suitable range of the ratio of the copper ion to the zinc ion. This may be caused by that nonalloy deposition such as oxide or hydroxide becomes large when the concentration of alkali is low and as the result the acid resistance of the layer becomes low.

Further, when the concentration of alkali is low and in other words in such a case that sodium hydroxide is lower than 30 g/l, it causes a bad influence that precipitation of zinc hydroxide occurrs and the zinc hydroxide is deposited together in the treated layer. As the result, an operative efficiency such as jamming of a filter goes down greatly.

It is preferable that the temperature of the bath at the time of electrolysis is lower than 35° C. Where the temperature is higher than 35° C., the resistance to hydrochloric acid of the deposited layer sometimes becomes low.

The current density is set in a range of $2 \sim 15$ A/dm$^2$, preferably a range of $5 \sim 10$ A/dm$^2$. The property of anti hydrochloric acid of the layer bocomes low sometimes in the low current density lower than 5 A/dm$^2$. Contrary to this, when the high current density is higher 10 A/dm$^2$, the deposition is powderized or and sometimes it causes etching stains (residue). This tendency remarkably appears in alkali etching rather than etching of cupric chloride.

In order to obtain a good layer superior in the resistance to hydrochloric acid under the low current density, it is better to make the concentration of the copper ion to be lower than 5 g/l of the copper ion supplying source and that of zinc ion to be lower than 4 g/l of the zinc ion supplying source.

The time of electrolysis is suitable in a range of $5 \sim 30$ seconds. When the time is short, the coated thickness becomes thin and it becomes weak in heat resistance. The long time electrolysis is uneconomical and it is not preferable since copper purity sometimes becomes low.

It is preferable that the method of preparing the copper-zinc bath used in this invention comprises the steps of solving a tartrate, throwing thereinto salts as metallic ion supplying sources, agitating them in a state of semi-turbidity, and throwing thereinto an alkali and solving same while agitating them. For example, in the case of sulfate, supply of the metallic ion to be spent is carried out by adding into the bath a copper and a zinc as a high concentration liquid in which they are solved in a water, and a tartrate is solved as well and added into the bath.

It is preferable to use an insoluble anode such as platinum as anode, considering an operative efficiency.

A treated layer of copper-zinc may be formed by the composition of the treating bath under the conditions as mentioned above. It is preferable to form the treated layer to be a copper foil which has a rough surface, in order to enhance peel strength of the copper foil against resin. As the method of forming a rough surface with the copper foil, it may for example use such a method of treating the copper foil in an acid copper plating bath by means of cathodic electrolysis, as diclosed in Japanese patent publication No. 45-34245.

The method of treating a surface according to the present invention provides a chromatic treatment as a necessary condition after the treated layer of copper-zinc is formed with the copper foil, so as to enhance the resistance to hydrochloric acid and also peel strength by means of the chromate treatment. As the chromate treatment, for example, it may choose a manner of immersing the copper foil in such a treating bath including such as chromium trioxide, sodium dichromate, potassium dichromate or the like, or a manner of cathodic electrolysis. The resistance to Brown transfer becomes better in the case of cathodic electrolysis rather than immersion into the bath. It is sufficient to set the bath in the room temperature and it is no problem that pH of the bath is acid or alkali.

The copper-zinc bath as mentioned above may be substituted for a copper-zinc-nickel bath by adding nickel ion thereto.

This aims at preventing an occurence of etching stains in applying high current density in electrolysis.

The addition of nickel ion may equalize an appearance of the treated surface, and in a range of high current density of the electrolysis the deposition to be powdered may be controlled, and therefore occurrence of etching stains may be prevented. In the case of addition of the nickel, it is confirmed with observation by an electron microscope that an abnormal powdered deposition may be controlled in the deposition under high current density. Further, when nickel is added, the characteristics of heat resistance become better slightly. Nickel sulfate or the like may be used as a supplying source of nickel ion and its concentration is suitable within a range of $0.4 \sim 30$ g/l. Even if a great amount of nickel is added, a deposition ratio of nickel could be lowered and a content of nickel in the deposition would be lower than 5 Wt %.

It is preferable that the temperature of the bath at the time of cathodic electrolysis is lower than 35° C. When the temperature is higher than 35° C., the resistance to hydrochloric acid of the deposited layer sometimes becomes low.

The current density of cathodic electrolysis is set in a range of $2 \sim 20$ A/dm$^2$, preferably a range of $5 \sim 15$ A/dm$^2$. The resistance to hydrochloric acid of the deposited layer becomes low sometimes in the low current density lower than 5 A/dm$^2$.

Contrary to this, when the high current density is higher than 20 A/dm$^2$, it is not economical. Further, where nickel is not added, a deposition is pulvarized or powdered with the current density of 10 A/dm$^2$ and sometimes etching stains occur, and it causes lowering of insulation. This tendency remarkably appears in etching of alkali rather than etching of cupric chloride. However, when nickel is added, it brings about an advantage that the powdering deposition may be prevented.

By the way, the followings are the same as those in the case of the above mentioned copper-zinc bath. Namely, a copper ion supplying source, copper ion density, zinc ion density, ratio of copper ion to zinc ion, a tartaric acid supplying source, an alkali supplying source and intensity of alkali.

It is preferable that the method of preparing a copper-zinc-nickel bath used in this invention comprises the steps of solving a tartrate, throwing thereinto salts as metallic ion supplying sources, agitating them in a state of semiturbidity, and throwing thereinto an alkali and solving same while agitating them. For example, in the case of sulfate, supply of the metallic ion to be spent is carried out by adding into the bath a copper and a zinc as a high concentration solution, and a nickel is solved together with a tartaric acid salt solution and added into the bath. It is preferable to use an insoluble anode such as platinum, considering an operative efficiency.

A treated layer of copper-zinc-nickel may be formed with the composition of a bath and under the conditions as mentioned above. It is preferable to form the treated layer to be a copper foil which has a rough surface, in order to enhance peel strength of the copper foil against resin. A method of forming a rough surface with the copper foil in an acid copper plating bath by means of cathodic electrolysis, is disclosed in Japanese patent publication No. 45-34245. The treated layer comprises 49.8–85 wt. % copper, 15–50 wt. % zinc and 0.2–5 wt. % of nickel.

The method of surface treatment according to the present invention has a necessary condition to provide a chromate treatment after the treated layer of copper-zinc-nickel is formed with the copper foil, so as to enhance the resistance to hydrochloric acid and also peel strength by means of the chromate treatment. As the chromate treatment, for example, it may choose a manner of immersing the copper foil in the bath including such as chromium trioxide, sodium dichromate, potassium dichromate or the like, or a manner of cathodic electrolysis. The resistance to Brown transfer becomes better in the case of cathodic electrolysis rather than immersion into the bath. It is sufficient to set the bath in the room temperature and it is no problem that pH of the bath is acid or alkaline.

As mentioned above, the surface treatment of the copper foil for printed circuit boards according to the present invention has been completed.

BRIEF DESCRIPTION OF THE DRAWINGS

The photographs show embodiments of the present invention in which.

DETAILED DESCRIPTION OF THE EMBODIMENTS

Figure 1:
FIG. 1 is a photograph by an electron microscope showing the particle construction appearing on the treated surface of a copper foil according to an embodiment No. 2 as shown in Table 3.

An embodiment of this invention using a copper-zinc bath will be described below.

The electrolized copper foil having a thickness of 35 $\mu$m, which was pre-treated to have a rough surface, was electrolized as a cathode in the bath including each of the compositions and under the treatment conditions as indicated in Table-1. The bath temperature was set always at 30° C. and platinum was used for the anode. Next, the copper foil was washed with a water and then it was electrolized as a cathode in an aqueous solution solving sodium dichromate at the concentration of 10 g/l, and under the current density of 0.3 A/dm$^2$ for 5 seconds. Then, the copper foil was washed with a water and dried. The copper foil was laminated onto a glass-/epoxy substrate of grade FR-4, and formed to obtain a copper clad laminate and then many kinds of characteristics are examined with respect to the laminate. The test result is shown in Table-2.

By the way, Comparative Example-1 is shown in Table-2 as a test result of many kinds of characteristics of the copper, which was obtained by the following method. The method comprises the steps of electrolizing, in a manner of cathodic electrolysis, the copper foil having a thickness of 35 $\mu$m, which was pre-treated to have a rough surface, in an aqueous solution solving sodium dichromate at the concentration of 10 g/l, and under the current density of 0.3A/dm$^2$ for 5 seconds, as was done in the same conditions as the above mentioned embodiment, and then, the copper foil was washed with a water and dried. The copper foil was laminated onto a glass/epoxy substrate of grade FR-4 in the above mentioned embodiment.

Further, Comparative Example-2 is shown as well in Table-2, as a test result of many kinds of characteristics of the copper clad laminate, which was obtained by the following method. The method comprises the steps of electrolizing the copper foil having a thickness of 35 $\mu$m, which was pre-treated to have a rough surface, as a cathode in an aqueous solution solving zinc oxide at the concentration of 6 g/l and also sodium hydroxide at the concentration of 45 g/l, and in the bath temperature of 30° C., under the current density of 5 A/dm$^2$ for 15 seconds. Then, the copper foil was washed with a water and electrolized as a cathode in an aqueous solution solving sodium dichromate at the concentration of 10 g/l, and under the current density of 0.3 A/dm$^2$ for 5 seconds, as was done in the same conditions as the above mentioned embodiment, and then washed and dried. Thereafter, the copper foil was laminated on to the same glass/epoxy substrate as the above mentioned embodiment.

TABLE 1

|  | No. | Composition of Bath (g/l) | | | | | Conditions of Treatment | |
|---|---|---|---|---|---|---|---|---|
|  |  | CuSO$_4$ 5H$_2$O | ZnSO$_4$ 7H$_2$O | NiSO$_4$ 6H$_2$O | Rochelle salt | Intensity of alkali | Current Density (A/dm$^2$) | Time of electrolysis (sec.) |
| Embodiments | 1 | 30 | 15 | 0 | 100 | 70 | 5 | 10 |
|  | 2 | 30 | 15 | 0 | 100 | 100 | 5 | 10 |
|  | 3 | 30 | 15 | 0 | 100 | 130 | 6 | 8 |
|  | 4 | 30 | 15 | 0 | 100 | 50 | 5 | 10 |
|  | 5 | 30 | 20 | 0 | 150 | 60 | 8 | 10 |
|  | 6 | 20 | 20 | 0 | 100 | 90 | 7 | 10 |
|  | 7 | 15 | 10 | 0 | 70 | 60 | 4 | 20 |
|  | 8 | 45 | 20 | 0 | 150 | 85 | 7 | 10 |

TABLE 1-continued

| | | Composition of Bath (g/l) | | | | Conditions of Treatment | |
|---|---|---|---|---|---|---|---|
| | No. | CuSO$_4$ 5H$_2$O | ZnSO$_4$ 7H$_2$O | NiSO$_4$ 6H$_2$O | Rochelle salt | Intensity of alkali | Current Density (A/dm$^2$) | Time of electrolysis (sec.) |
| | 9 | 27 | 10 | 0 | 100 | 60 | 5 | 10 |
| | 10 | 25 | 15 | 20 | 100 | 65 | 10 | 10 |
| | 11 | 30 | 18 | 10 | 100 | 75 | 10 | 10 |
| | 12 | 30 | 18 | 0 | 100 | 75 | 10 | 10 |
| | 13 | 25 | 15 | 50 | 130 | 90 | 8 | 15 |
| | 14 | 25 | 15 | 30 | 120 | 90 | 8 | 15 |

TABLE 2

| | | Peel Strength *1 | | | | Undercutting in etching of cupric chloride *3 | Etching of alkali | |
|---|---|---|---|---|---|---|---|---|
| | | Nomal state kg/cm | After immersion in HCl *2 | | After 10 days at 177° C. kg/cm | | Stains *4 | Brown transfer effect *5 |
| | No. | | kg/cm | Deterioration % | | | | |
| Embodiments | 1 | 2.14 | 2.08 | 2.8 | 0.70 | ○ | ○ | ○ |
| | 2 | 2.17 | 2.10 | 3.2 | 0.73 | ○ | ○ | ○ |
| | 3 | 2.14 | 2.09 | 2.3 | 0.65 | ○ | ○ | ○ |
| | 4 | 2.22 | 2.00 | 9.9 | 0.60 | ○ | ○ | ○ |
| | 5 | 2.16 | 2.06 | 4.6 | 0.80 | ○ | ○ | ○ |
| | 6 | 2.17 | 2.03 | 6.5 | 0.70 | ○ | ○ | ○ |
| | 7 | 2.15 | 2.08 | 3.3 | 0.73 | ○ | ○ | ○ |
| | 8 | 2.14 | 2.14 | 0.0 | 0.70 | ○ | ○ | ○ |
| | 9 | 2.15 | 2.09 | 2.8 | 0.68 | ○ | ○ | ○ |
| | 10 | 2.21 | 2.20 | 0.5 | 0.92 | ○ | ○ | ○ |
| | 11 | 2.24 | 2.17 | 3.1 | 0.96 | ○ | ○ | ○ |
| | 12 | 2.18 | 2.12 | 2.8 | 0.72 | ○ | □ | ○ |
| | 13 | 2.12 | 2.09 | 1.4 | 1.03 | ○ | ○ | ○ |
| | 14 | 2.07 | 2.01 | 2.9 | 0.93 | ○ | ○ | ○ |
| Compara. Exams. | 1 | 2.11 | 2.01 | 4.7 | 0.08 | ○ | ○ | Δ |
| | 2 | 2.10 | 1.64 | 21.9 | 0.76 | X | ○ | ○ |

*1 According to 5.7 of JIS-C-6481-1986. wherein a width of line was set 1 mm.
*2 Immersion for 60 minutes at 25° C. in 20% HCl.
*3 Composition of etching solution of cupric chloride: CuCl$_2$ 80 g/l, NaCl 60 g/l. HCl (36%) 25 cc/l. ○: No undercut. X: Undercut is large. Not practicable.
*4 Alkali etching: Alka-Etch made of Yamatoya Shokai K.K. ○: No stains. □: Stains exist very little. No problem in practice in ordinary purposes of use. X: Stains exist.
*5 The etched surface of the board was heated by an oven at 170° C. for an hour. ○: No change in color. Δ: Color changed a little.

The test result of many kinds of characteristics in Table-2 clarifies that the copper foil for printed circuits obtained by the treating method of this invention is superior in chemical resistance and/or heat resistance, comparing with one obtained by the treating method of the conventional Comparative Example.

The present invention using a copper-zinc bath has the following advantages:

High efficiency is found in the characteristics of the copper foil obtained by the present invention. Namely, the copper foil is superior in peel strength against resin and also superior in heat resistance of high temperature and long time heating test, and also satisfies requirements against chemical resistance to hydrochloric acid, and the resistance to Brown transfer and etching stains are not found. In other words, the copper foil obtained by this invention is suitable for not only an ordinary mulilayer printed circuit boards, but also high density printed circuit boards. Further, The bath used in this invention does not use cyanide at all and therefore the method of this invention is superior in view point of public pollution and very practicable in view of easiness in operations.

Next, another embodiment of the present invention using a copper-zinc-nickel bath will be described in detail as follows:

The electrolized copper foil having a thickness of 35 μm, which was pre-treated to have a rough surface, was electrolized as a cathode in the bath including each of the compositions and under the treatment conditions as indicated in Table-3. The bath temperature was set always at 30° C. Next, the copper foil was washed with a water and then it was electrolyzed as a cathode in an aqueous solution solving sodium dichromate at the concentration of 10 g/l, and under the current density of 0.3 A/dm$^2$ for 5 seconds. Then copper foil was laminated onto a glass/epoxy substrate of grade FR-4, and formed to obtain a copper clad laminate and then many kinds of characteristics are examined with respect to the laminate. The test result is shown in Table-3.

By the way, Comparative Example-1 is shown in Table 3 as a test result of many kinds of characteristics of the copper, which was obtained by the following method. The method comprises the steps of electrolizing, as a cathode, the copper foil having a thickness of 35 μm, which was pre-treated to have a rough surface, in an aqueous solution solving sodium dichromate at the concentration of 10 g/l, and under the current density of 0.3 A/dm$^2$ for 5 seconds, as was done in the same conditions as the above mentioned embodiment, and then the copper foil was washed with a water and dried. The copper foil was laminated onto a glass/epoxy substrate of grade FR-4 in the above mentioned embodiment.

Further, Comparative Example-2 is shown as well in Table-3, as a test result of many kinds of characteristics of the copper clad laminate, which was obtained by the following method. The method comprises the steps of electrolyzing the copper foil having a thickness of 35 μm, which was pre-treated to have a rough surface, as a cathode in an aqueous solution solving zinc oxide at the concentration of 6 g/l, and also sodium hydroxide at the concentration of 45 g/l, and in the bath temperature of 30° C., under the current density of 5 A/dm² for 15 seconds. Then, the copper foil was washed with a water and electrolized as a cathode in an aqueous solution solving sodium dichromate at the concentration of 10 g/l, and under the current density of 0.3 A/dm² for 5 seconds, as was done in the same conditions as the above mentioned embodiment, and then washed and dried. Thereafter, the copper foil was laminated onto the same substrate as the above mentioned embodiment.

Further, the test results of many characteristics of the laminate are indicated as Comparative Example Nos. 3~12 in Table-3. The laminate was obtained by the steps of electrolizing a copper foil with 10 kinds of the bath composition and under the conditions as indicated in Table-3, by utilizing the same conditions as the above mentioned embodiment except using the copper-zinc bath excluding nickel. The copper foil was pre-treated to have a rough surface as the above mentioned embodiment, and had a thickness of 35 μm. Then, the copper foil was washed with a water and thereafter electrolized in the bath of sodium dichromate at the concentration of 10 g/l, and under the current density of 0.3 A/dm² for 5 seconds, as was done in the above first embodiment, and then washed and dried. Thereafter, the copper foil was laminated onto the same base substrate as the above mentioned embodiment.

The test result of many kinds of charateristics in Table-3 clarifies that the copper foil for printed circuit boards of this invention is superior in heat resistance or chemical resistance, comparing with a conventional barrier layer, and by including nickel, it has no problem of etching stains in comparison with a copper-zinc barrier layer which does not include nickel, and its heat resistance goes up.

Figure 2:
FIG. 2 is another photograph by an electron microscope showing the particle construction appearing on the treated surface of a copper foil according to an embodiment No. 12 as shown in Table 3.

FIGS. 1 and 2 are the electron micrographs which show the shapes of the treated copper foil of the embodiment No. 2 in this invention and Comparative Example No. 12. As will be clear from the photograph taken by the electron microscope, powdery deposition is not found in the embodiment No. 2 wherein nickel ion is added, comparing with Comparative Example No. 12 wherein nickel ion is not added. Namely, addition of nickel ion functions to prevent powdery deposition.

TABLE 3

| | | Composition of Bath (g/l) | | | | Conditions of Treatment | |
|---|---|---|---|---|---|---|---|
| | No. | CuSO₄ 5H₂O | ZnSO₄ 7H₂O | NiSO₄ 6H₂O | Rochelle salt | Intensity of alkali | Current Density (A/dm²) | Time of electrolysis (sec.) |
| Embodiments | 1 | 25 | 15 | 20 | 100 | 65 | 10 | 10 |
| | 2 | 30 | 18 | 10 | 100 | 75 | 10 | 10 |
| | 3 | 25 | 15 | 50 | 130 | 90 | 8 | 15 |
| | 4 | 25 | 15 | 30 | 120 | 90 | 8 | 15 |
| | 5 | 20 | 10 | 100 | 160 | 70 | 15 | 20 |
| | 6 | 18 | 10 | 80 | 150 | 70 | 8 | 30 |
| | 7 | 26 | 12 | 15 | 120 | 85 | 8 | 20 |
| | 8 | 26 | 12 | 2 | 120 | 85 | 8 | 20 |
| Comparative Examples | 1 | | | | | | | |
| | 2 | | | | | | | |
| | 3 | 25 | 15 | 0 | 100 | 70 | 10 | 15 |
| | 4 | 25 | 15 | 0 | 100 | 70 | 15 | 15 |
| | 5 | 30 | 15 | 0 | 100 | 130 | 6 | 8 |
| | 6 | 30 | 15 | 0 | 100 | 50 | 5 | 10 |
| | 7 | 30 | 20 | 0 | 150 | 60 | 8 | 10 |
| | 8 | 20 | 20 | 0 | 100 | 90 | 7 | 10 |
| | 9 | 15 | 10 | 0 | 70 | 60 | 4 | 20 |
| | 10 | 45 | 20 | 0 | 150 | 85 | 7 | 10 |
| | 11 | 27 | 10 | 0 | 100 | 60 | 5 | 10 |
| | 12 | 30 | 18 | 0 | 100 | 75 | 10 | 10 |

| | | Peel Strength *1 | | | | | | Composition of Barrier Wt % | |
|---|---|---|---|---|---|---|---|---|---|
| | | Nomal state | After immersion in HCl *2 | After 10 days at 177° C. | Undercutting in etching of cupric chloride *3 | Etching of alkali | | | |
| | No. | kg/cm | Deterioration % | kg/cm | | Stains *4 | Brown transfer effect *5 | Zinc | Nickel |
| Embodiments | 1 | 2.21 | 2.20 / 0.5 | 0.92 | ○ | ○ | ○ | 34.8 | 0.8 |
| | 2 | 2.24 | 2.17 / 3.1 | 0.96 | ○ | ○ | ○ | 36.0 | 0.5 |
| | 3 | 2.12 | 2.09 / 1.4 | 1.03 | ○ | ○ | ○ | 38.4 | 1.2 |
| | 4 | 2.07 | 2.01 / 2.9 | 0.93 | ○ | ○ | ○ | 36.7 | 1.0 |
| | 5 | 2.16 | 2.04 / 5.6 | 0.72 | ○ | ○ | ○ | 28.3 | 3.2 |
| | 6 | 2.20 | 2.09 / 5.0 | 0.70 | ○ | ○ | ○ | 37.5 | 2.5 |
| | 7 | 2.17 | 2.15 / 0.9 | 0.90 | ○ | ○ | ○ | 30.3 | 0.8 |
| | 8 | 2.19 | 2.15 / 1.8 | 0.84 | ○ | ○ | ○ | 34.0 | 0.2 |
| Comparative Example | 1 | 2.11 | 2.01 / 4.7 | 0.08 | ○ | ○ | △ | | |
| | 2 | 2.10 | 1.64 / 21.9 | 0.76 | X | ○ | ○ | | |
| | 3 | 2.15 | 2.07 / 3.7 | 0.80 | ○ | □ | ○ | | |
| | 4 | 2.12 | 2.06 / 2.8 | 0.85 | ○ | X | ○ | | |
| | 5 | 2.14 | 2.09 / 2.3 | 0.65 | ○ | ○ | ○ | | |
| | 6 | 2.22 | 2.00 / 9.9 | 0.60 | ○ | ○ | ○ | | |
| | 7 | 2.16 | 2.06 / 4.6 | 0.80 | ○ | ○ | ○ | | |
| | 8 | 2.17 | 2.03 / 6.5 | 0.70 | ○ | ○ | ○ | | |
| | 9 | 2.15 | 2.08 / 3.3 | 0.73 | ○ | ○ | ○ | | |
| | 10 | 2.14 | 2.14 / 0.0 | 0.70 | ○ | ○ | ○ | | |
| | 11 | 2.15 | 2.09 / 2.8 | 0.68 | ○ | ○ | ○ | | |

TABLE 3-continued

| 12 | 2.18 | 2.12 | 2.8 | 0.72 | ○ | □ | ○ |

*1 According to 5.7 of JIS-C-6481-1986, wherein a width of line was set 1 mm.
*2 Immersion for 60 minutes at 25° C. in 20% HCl.
*3 Composition of etching solution of cupric chloride: $CuCl_2$ 80 g/l, NaCl 60 g/l, HCl (36%) 25 cc/l.  ○: Non undercut.  X: Undercut is large. Not practicable.
*4 Alkali etching: Alka-Etch made of Yamatoya Shokai K.K. ○: No stains.  □: Stains exist very little. No problem in practice in ordinary purposes of use.  X: Stains exist.
*5 The etched surface of the base plate was heated by an oven at 170° C. for an hour.  ○: No change in color.  Δ: Color changed a little.

The present invention using a copper-zinc-nickel bath has the following advantages:

High efficiency is found in the characteristics of the copper foil obtained by the present invention. Namely, the copper foil is superior in peel strength against resin and also superior in heat resistance such as high temperature and long time heating test, and also satisfies requirements against chemical resistance to hydrochloric acid, and the resistance to Brown transfer and etching stains are not found. In other words, the copper foil obtained by this invention is suitable for not only an ordinary multilayer printed circuit boards, but also high or super-high density printed circuit boards. Furthermore, the bath used in this invention does not use cyanide at all and therefore the method of this invention is superior in view point of public pollution and very practicable in view of easiness in operations.

What is claimed is:

1. A copper foil for printed circuit boards comprising:
a copper foil layer, and
a barrier layer provided on at least one side of the copper foil layer, the barrier layer comprising 49.8-85 weight percent copper, 15-50 weight percent zinc and 0.2-5 weight percent nickel.

* * * * *